United States Patent
Miyauchi et al.

(10) Patent No.: US 9,865,381 B2
(45) Date of Patent: Jan. 9, 2018

(54) CHIP WITH PROTECTION FUNCTION AND METHOD FOR PRODUCING SAME

(71) Applicant: EPCOS AG, Munich (DE)

(72) Inventors: Yasuharu Miyauchi, Graz (AT); Pavol Dudesek, Deutschlandsberg (AT); Christian Faistauer, Frauental (AT); Gerhard Fuchs, Steinerkirchen (AT); Stefan Obermair, Stainz (AT); Klaus-Dieter Aichholzer, Deutschlandsberg (AT); Christian Block, Stainz (AT); Sebastian Brunner, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 15/113,397

(22) PCT Filed: Jan. 2, 2015

(86) PCT No.: PCT/EP2015/050006
§ 371 (c)(1),
(2) Date: Jul. 21, 2016

(87) PCT Pub. No.: WO2015/113778
PCT Pub. Date: Aug. 6, 2015

(65) Prior Publication Data
US 2017/0011827 A1 Jan. 12, 2017

(30) Foreign Application Priority Data
Jan. 29, 2014 (DE) ........................ 10 2014 101 092

(51) Int. Cl.
*H01C 7/10* (2006.01)
*H01C 7/12* (2006.01)
(Continued)

(52) U.S. Cl.
CPC ............... *H01C 7/12* (2013.01); *C03C 3/089* (2013.01); *H01C 7/1006* (2013.01); *H01C 7/112* (2013.01);
(Continued)

(58) Field of Classification Search
CPC .......... H01C 7/12; H01C 7/1006; H01C 7/18; H01C 17/283; H01C 17/285
(Continued)

(56) References Cited

U.S. PATENT DOCUMENTS

| 5,096,620 A | 3/1992 | Ditz et al. |
| 7,075,405 B2 | 7/2006 | Takehana et al. |

(Continued)

FOREIGN PATENT DOCUMENTS

| DE | 4005011 C1 | 4/1991 |
| DE | 10359264 A1 | 7/2004 |

(Continued)

*Primary Examiner* — Kyung Lee
(74) *Attorney, Agent, or Firm* — Slater Matsil, LLP

(57) ABSTRACT

A chip and a method for manufacturing a chip are disclosed. In an embodiment, the chip includes a varistor layer composed of zinc oxide, a multilayered electrode structure which realizes a varistor function in the varistor layer and at least two solderable or bondable external contacts on a first main surface of the varistor layer. The chip further includes a glass layer disposed on the first main surface leaving only the external contacts uncovered, wherein the glass layer includes, as main constituents, oxides of Si and/or Ge, B and K, which in total have at least 70% by weight of the constituents of the glass layer, and wherein the glass layer is substantially free of Al, Ga, Cr and Ti.

15 Claims, 3 Drawing Sheets

(51) Int. Cl.
　　　*C03C 3/089*　　　(2006.01)
　　　*H01C 7/112*　　　(2006.01)
　　　*H01C 7/18*　　　(2006.01)
　　　*H01C 17/28*　　　(2006.01)
　　　*H01L 25/16*　　　(2006.01)

(52) U.S. Cl.
　　　CPC ............ *H01C 7/18* (2013.01); *H01C 17/285* (2013.01); *H01L 25/167* (2013.01); *H01L 2924/0002* (2013.01)

(58) Field of Classification Search
　　　USPC .......................................................... 338/21
　　　See application file for complete search history.

(56) References Cited

U.S. PATENT DOCUMENTS

| | | | | |
|---|---|---|---|---|
| 8,058,965 | B2* | 11/2011 | Block | H01C 1/148 |
| | | | | 257/774 |
| 8,970,324 | B2* | 3/2015 | Dudesek | H01C 7/18 |
| | | | | 333/185 |
| 9,142,340 | B2* | 9/2015 | Itami | H01C 1/148 |
| 2008/0238604 | A1 | 10/2008 | Sato et al. | |
| 2008/0238605 | A1 | 10/2008 | Yoshida et al. | |
| 2011/0188161 | A1 | 8/2011 | Feichtinger et al. | |

FOREIGN PATENT DOCUMENTS

| | | |
|---|---|---|
| DE | 102008024479 A1 | 12/2009 |
| EP | 1096512 A2 | 5/2001 |
| EP | 1298099 A1 | 4/2003 |
| JP | 3173402 A | 7/1991 |
| JP | 200788173 A | 4/2007 |
| JP | 2008273818 A | 11/2008 |
| JP | 2008277716 A | 11/2008 |

* cited by examiner

CHIP WITH PROTECTION FUNCTION AND METHOD FOR PRODUCING SAME This patent application is a national phase filing under section 371 of PCT/EP2015/050006, filed Jan. 2, 2015, which claims the priority of German patent application 10 2014 101 092.2, filed Jan. 29, 2014, each of which is incorporated herein by reference in its entirety.

TECHNICAL FIELD

The application relates to a chip with protection function and small structural height which is surface-mountable.

BACKGROUND

In order to protect sensitive installations, components and networks against ESD (electrostatic discharge) it is possible to use discrete components with varistor function. These are nonlinear components whose resistance decreases greatly when a specific applied voltage is exceeded. Varistors are therefore suitable for harmlessly dissipating overvoltage pulses. Varistors are produced from a zinc oxide ceramic with grain structure.

It is difficult to integrate varistors in multilayer ceramics and so varistors are usually used as discrete components. Surface-mountable varistors require solderable or bondable metallizations, which then necessarily have to be applied on the zinc oxide surface of the varistor. When producing these contacts, however, the problem arises that solderable and bondable contacts of good quality can be produced only with electrolytic reinforcement. However, the electroplating baths usually used are set up to be acidic or basic and are therefore suitable for dissolving the zinc oxide of the varistors.

An electrolytic coating for producing the solderable or bondable contacts of zinc oxide varistors therefore requires a suitable protective layer for the zinc oxide surface that is not to be coated.

Glass-based protective layers which enable a structured production of contacts have already been proposed. However, it has been found that varistors having a glass coating exhibit a degradation manifested in an intensifying leakage current, also reverse current. Circuits having such varistors exhibit a current consumption increased beyond the permissible value. Furthermore, the degradation may be manifested as a rise in the grain resistance and lead to an increase in the terminal voltage. While the problem of degradation leads only to a relatively slight degradation in the case of thick varistor components, the degradation has an effect all the greater as varistor components become thinner.

SUMMARY OF THE INVENTION

Embodiments of the present invention specify a surface-mountable chip with protection function which has a small structural height in conjunction with low reverse current whilst complying with the requirements made of $U_C$ and the varistor voltage $U_V$. Further embodiments of the invention specify a substrate for electrical components with high evolution of heat.

It has been found that the abovementioned degradation effects in the case of varistor components can be assigned to specific ions which diffuse from the glass protective layer into the ceramic and adversely affect the varistor function. It has further been found that the problem can be solved by using a glass protective layer which comprises as main constituents oxides of silicon and/or germanium, of boron and potassium and which in this case is substantially free of disturbing additives such as aluminum, gallium, chromium and titanium. In this case, substantially free means a content which is significantly less than one percent by weight, preferably less than half of one percent by weight, in relation to the total glass composition. Proportions of these disturbing additives close to 1% by weight and above otherwise result in appreciable changes of UC and IC. In this case, the main constituents make up at least 70% by weight of the constituents of the glass layer. It is also possible for the glass layer used to consist exclusively of the main constituents mentioned.

On a varistor layer composed of zinc oxide which has a glass layer of the stated composition as a protective and mask layer, a metallization produced directly on the varistor layer can be reinforced electrolytically or in an electroless manner in a standard electroplating bath without any problems, and without the zinc oxide surface being attacked by the electroplating bath in the process. The glass layer also does not produce any degradation whatsoever in the varistor layer.

The chips with varistor function and having a metallization reinforced to a sufficient thickness for the solderable and/or bondable external contacts and connection pads exhibit long-term stability and no reduction of their properties, and in particular no impermissible rise in the leakage current. This shows that the indiffusion of disturbing ions and the electrical degradation of the varistors that is initiated thereby can be successfully prevented by the use of a glass layer of the stated composition.

The varistor function is realized in a conventional manner known per se by a multilayered electrode structure within the varistor layer which is electrically connected to the external contacts.

In one embodiment of the invention, the varistor layer has on a second main surface electrical connection pads suitable for connecting an electrical component. The connection pads are designed in particular for the surface mounting of an electrical component on the second main surface.

The electrical connection pads are electrically connected to the electrode structure in the varistor layer and thus to the varistor. At least one further connection pad is connected to the external contacts on the first main surface of the varistor layer via corresponding connecting lines. This makes it possible to contact both the varistor and the component mounted thereon via the external contacts. The chip serves as a carrier for the electrical component. The varistor layer of the chip, on account of its high thermal conductivity of $\lambda > 30$ W/mK, is particularly suitable for transporting away heat loss possibly generated by the component through the varistor layer. If the chip and thus the component mounted on the chip is mounted in a circuit environment and in particular on a printed circuit or a printed circuit board, then the heat loss of the component can be dissipated well through the chip, without impermissible heating of the component occurring. Since the absolute heat dissipation is indirectly proportional to the layer thickness of the substrate or here of the chip, a sufficiently thin chip affords the further advantage of an improved thermal conductivity. The chip or the varistor layer can have a layer thickness of a maximum of 1000 μm, a maximum of 500 μm, and in particular of approximately 250 μm, without the varistor function or the mechanical stability being impermissibly impaired by a decreasing layer thickness.

The protection function which a varistor such as the one realized in the chip according to the invention can have increases with the electrode area in the varistor. The greater the electrode area, the greater the current dissipating capability in the case of overvoltage. For a given chip size, the electrode area can be increased by the number of electrode layers being increased. A chip according to the invention therefore has at least four electrode layers arranged one above another and alternately connected to the two external contacts. Generally, however, a highest possible number of electrode layers is striven for in order to ensure a maximum current dissipating capability for a given layer thickness. A distance between different electrode layers that is reduced as a result for a given layer thickness can be compensated for by suitable doping and granulation of the zinc oxide material, such that a desired varistor voltage of desired magnitude can be set even with the number of electrode layers being increased.

Furthermore, it has been established that certain other additives useable in glass, in a glass layer according to the invention, also lead to disadvantages or undesired degradation of the varistor function and should therefore be avoided in the glass layer according to the invention on the varistor layer. It is advantageous, for example, if the glass layer is free of zinc oxide and of bismuth oxide. Zinc oxide and bismuth oxide adversely affect inter alia the glass stability in basic or acidic electroplating baths.

The thickness of the glass layer is generally chosen to be significantly thinner than the thickness of the varistor layer since the thermal conductivity of the glass layer is significantly poorer than that of the varistor layer. In one embodiment, fillers having a better thermal conductivity than $SiO_2$ are added to the glass layer.

Filler particles composed of zirconium oxide $ZrO_2$ improve the thermal conductivity of the glass layer and are suitable as filler in a glass layer according to the invention. Furthermore, neither the protection function of the glass layer nor the adhesion thereof on the zinc oxide layer is adversely affected by the filler particles.

Besides the main constituents Si and/or Ge, B and K, the glass layer can have further constituents which neither adversely affect the protection function of the glass layer nor disadvantageously influence the varistor function. Further permitted constituents are the oxides of metals selected from lithium, sodium, magnesium, calcium, strontium and barium. The glass layer can contain metal oxides of lithium and sodium in proportions of up to in each case a maximum of 5% by weight without the desired properties being adversely influenced thereby. Metal oxides of magnesium, calcium, strontium and barium can be added without disadvantages in an amount until a desired glass transition temperature of the glass layer is set.

Furthermore, the glass layer can also contain small amounts of yttrium and other lanthanides. Yttrium oxide can be contained up to approximately 7.5% by weight and at the same time is a preferred filler for the glass layer owing to its low diffusion in the varistor layer and its good thermal conductivity.

For the external contacts and, if present, the connection pads on the varistor layer, a base metallization present is preferably reinforced by electrolytic deposition. Preferred metals for producing or thickening the external contacts and connection pads comprise at least one of nickel, silver and gold. These materials are preferably used in acidic or basic electroplating baths, against which the varistor layer is reliably protected with the aid of the glass layer according to the invention.

The base metallization can be produced by printing and firing a conductive paste, as known in the case of other ceramics.

In one preferred embodiment, the component mounted on the chip is a light emitting diode (LED). LEDs generate a relatively high waste heat and at the same time are sensitive toward excessively high temperatures, such that here especially a good heat dissipation by the substrate is demanded. A chip having a varistor layer that is used as substrate according to the invention fulfils this objective in an advantageous manner. In addition, the chip can be produced with a suitable small layer thickness, at the same time constitutes a protective component against overvoltages which might damage the component in particular during its mounting, and overall permits a small structural height of the arrangement comprising chip and LED.

In order to produce a chip with varistor function, firstly the varistor layer is produced. For this purpose, firstly a stack is produced by stacking one above another green sheets printed with electrode material. The green sheets are produced from zinc oxide particles that are finely ground, doped, homogenized and processed with a solvent such as, for example, water and a binder to form a slip for sheet production. Plated-through holes through individual zinc oxide green sheets can be produced by stamping out holes, the so-called vias, which are then filled with electrode material. The electrode material is also used in the form of a printable paste likewise comprising finely divided constituents (metal particles, binder and solvent.

By means of corresponding structuring of the individual green sheets and corresponding arrangement of the green sheets one above another, the desired interconnection by means of the vias and the electrode layers is already produced in the stack. Afterward, the stack of green sheets is sintered to form a monolithic varistor layer having a multilayered electrode structure. Metallizations for the external contacts and the connection pads are then applied to the finished varistor layer, e.g., by printing a metallization paste onto the first and/or the second main surface of the varistor layer. A suitable printing method is screen printing, for example. The printed metallization paste on the main surfaces of the varistor layer defines external contacts and/or connection pads and in this case produces a base metallization in the desired regions.

For structuring the desired external contacts and/or connection pads, a glass paste according to the invention is then applied on the main surfaces above the base metallization such that the areas provided for the external contacts and/or connection pads remain uncovered.

In order to produce the glass layer, the constituents provided for the glass layer, in particular the oxides and/or carbonates of silicon and/or germanium or other suitable starting substances, and also boron and potassium are preferably melted and fritted to form a glass. Afterward, the glass is ground and homogeneously mixed. The printable paste is subsequently produced from the powder in the manner described and is subsequently printed.

The glass paste is subsequently fired and sintered for producing a glass layer. In this case, it is possible to sinter the metallization layer below the glass layer together with the printed glass paste. However, it is also possible firstly to sinter the base metallization and then to print the glass paste and then to sinter the arrangement once again.

In an electrolytic or electroless metallization bath, the base metallization can then be reinforced to a desired layer thickness, or a desired current-carrying capacity, in the regions not covered by the glass layer.

BRIEF DESCRIPTION OF THE DRAWINGS

The invention is explained in greater detail below on the basis of exemplary embodiments and the associated figures. The figures serve merely for illustrating the invention and are therefore not represented as true to scale. Therefore, neither absolute nor relative dimensional indications can be inferred from the figures.

In the figures:

FIG. 4b shows a variant of FIG. 4a;

DETAILED DESCRIPTION OF ILLUSTRATIVE EMBODIMENTS

Figure 1:
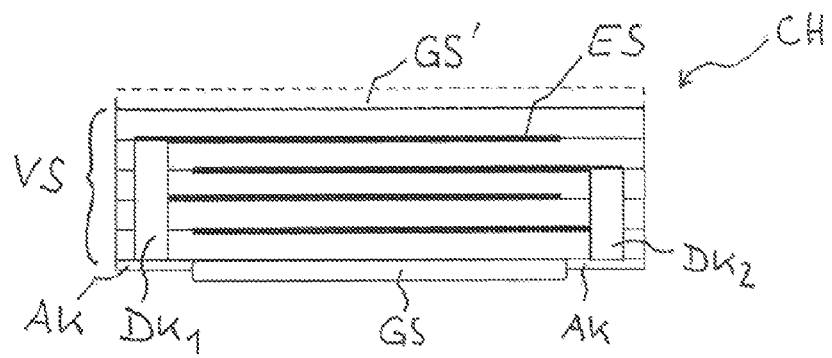
FIG. 1 shows a simple embodiment of a chip according to the invention in schematic cross section.

FIG. 1 shows a simple embodiment of a chip CH. The latter has, in integrated form, a multilayered electrode structure, wherein a plurality of electrode layers ES are arranged within the varistor layer VS in an overlapping manner one above another such that they can be connected to different electrodes or different contacts. In the embodiment illustrated, the electrode layers ES are alternately assigned to a first and second external contact AK and connected to the corresponding external contact AK via a respective plated-through hole DK1, DK2. The regions of the first main surface of the varistor layer VS which are not covered by the external contact AK are covered with a glass layer GS. Accordingly, the first main surface has either a glass layer covering or a metallization structured to form an external contact AK. The varistor layer comprising zinc oxide itself does not emerge at the first main surface. The second main surface of the varistor layer VS opposite the first main surface can also be covered with a glass layer GS' in order to protect it from aggressive baths such as are used for electroplating, for example.

Figure 2:
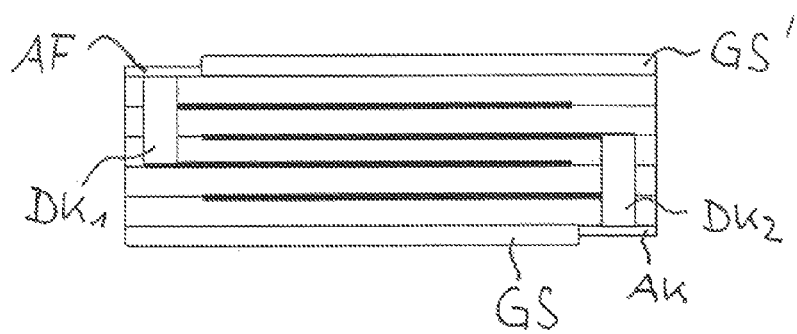
FIG. 2 shows a chip having external contacts and connection pads.

FIG. 2 shows a further embodiment of a chip according to the invention, wherein, in contrast to FIG. 1, besides an external contact AK on the first main surface, a connection pad AF is also present on the second main surface, said connection pad being connected to at least one part of the electrode structure within the varistor layer. In the embodiment illustrated, the varistor is thus contactable via a connection pad AF and an external contact AK, which here are arranged on different main surfaces. On the second main surface, too, a glass layer GS' is then arranged here, which omits only the connection pad AF and thus protects the varistor layer against aggressive media.

Figure 3:
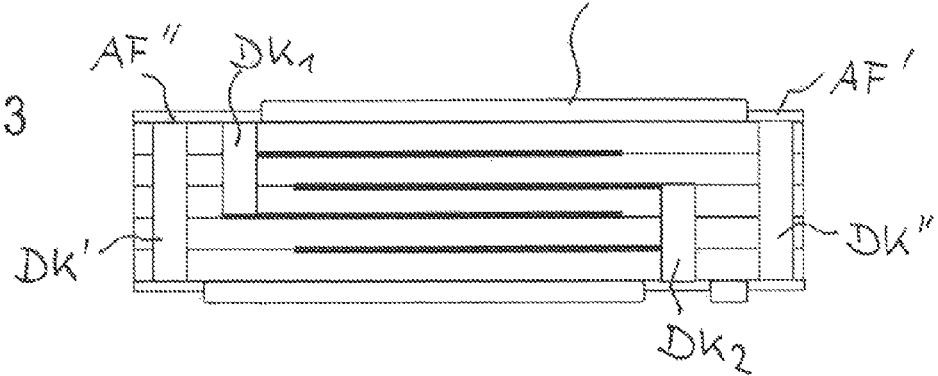
FIG. 3 shows a chip having plated-through holes.

FIG. 3 shows a further embodiment of a chip, wherein, in a manner similar to that in FIG. 2, both external contacts AK and connection pads AF are provided which contact the electrode structure of the varistor via plated-through holes DK1 and DK2 from the first and again from the second main surface. Two further plated-through holes DK' and DK" connect a respective external contact AK', AK" on the first main surface to a respective connection pad AF', AF" on the second main surface. The connection pad AF' is not directly connected to the electrode structure of the varistor, such that an electrical connection from the first to the second main surface is led via the external contact AK' and enables a further component to be connected. The connection pad AF" is connected to the electrode structure of the varistor via the plated-through hole. All connections of varistor and component connected thereto are possible in this way via the external contacts on the first main surface. Regions of the two main surfaces that are not occupied by external contacts AK and connection pads AF are covered by a glass layer GS and the varistor layer is thus protected.

Figure 4A:
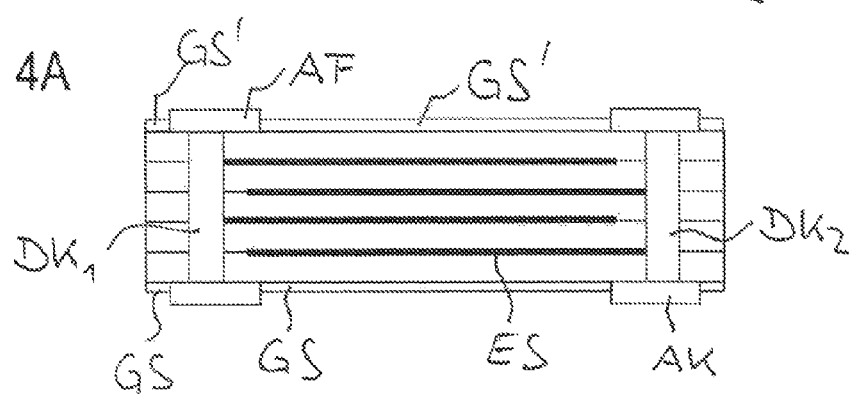
FIG. 4a shows a further embodiment of a chip.

FIG. 4a shows a chip similar to FIG. 1, wherein the plated-through holes DK1 and DK2 connect external contacts AK both to the electrode structure of the varistor and here additionally to connection pads AF on the second main surface. The connection pads AF and the external contacts AK are illustrated here with a larger layer thickness than the glass layer GS. Two connection pads AF suitable for connecting a component are thus present on the second main surface, via which an electrical component can be connected in parallel with the chip with varistor function and then protects the latter against overvoltages. Further connection pads AF and the external contacts AK are possible but not necessary for simple components. A voltage pulse which acts on the component or on the connection pads AF and exceeds the varistor voltage can then be dissipated harmlessly via the electrode structure toward the external contact AK.

Figure 4B:
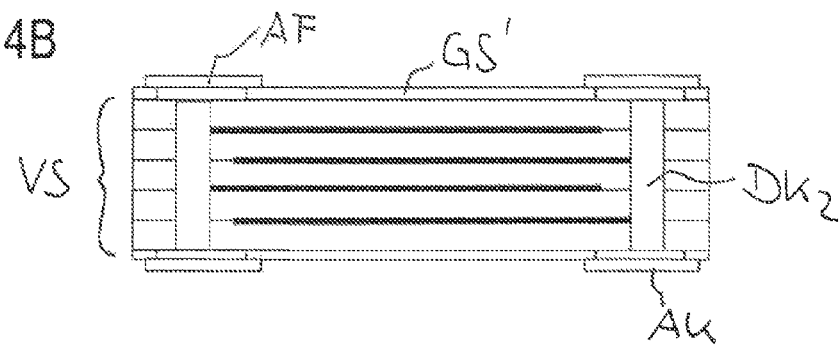

FIG. 4b shows a chip similar to FIG. 4a, wherein the connection pads AF and the external contacts AK are embodied as two- or multilayered metallization. In this case, it is possible for the respective upper sublayer—facing away from the chip—of the two- or multilayered metallization to have a larger area than the bottommost sublayer and partly also to overlap the glass layer. This has the advantage that a larger area is available for soldering or bonding with the component or with a circuit environment and that this larger area has a higher current-carrying capacity. The strength of a soldering connection or other bonding connection is also increased as a result.

Figure 5:
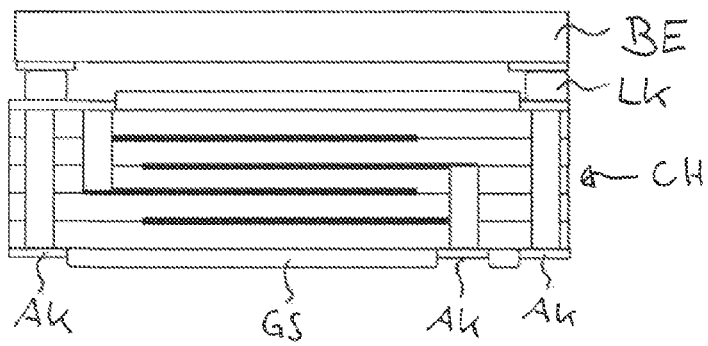
FIG. 5 shows a chip with an electrical component mounted on the second main surface.

FIG. 5 shows the chip from FIG. 3, wherein an electrical component BE is now mounted on the connection pads AF with the aid of a connecting means on the second main surface. Mounting can be carried out by means of soldering contacts LK, for example, as illustrated in the figure. In this way, an electrical and mechanical contact between chip and component BE is produced at the same time. The chip CH can thus serve as a carrier for the component BE and the component can be connected to a circuit environment via the external contacts AK of the chip CH. The varistor function integrated in the chip serves as protection for the component BE.

Figure 6:
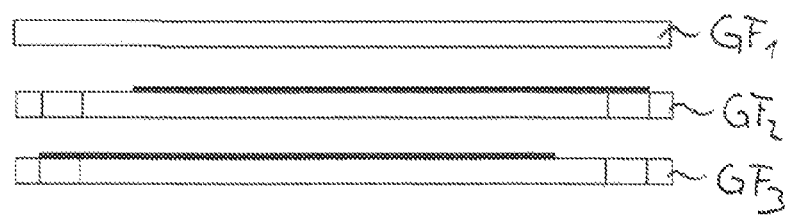
FIG. 6 shows various green sheets printed partly with electrode material, from which a varistor layer can be produced.

FIG. 6 shows three different green sheets GF1, GF2 and GF3 on the basis of a zinc oxide material, from which a chip according to the invention can already be assembled. The topmost green sheet GF1 illustrated has no structuring or metallization. The two lower green sheets are like image and mirror image, for example, and serve to connect the metallization, which indeed comprises a respective electrode layer, to one of two different plated-through holes. The plated-through holes are, e.g., stamped in the green sheets GF and the holes are then filled with conductive paste.

In order to produce this green sheet, a zinc oxide powder is finely ground, provided with a dopant and once again homogeneously mixed and ground. If appropriate, a glass forming agent is added in order to set the sintering temperature to a desired value. A certain shapability and cohesion of the green sheet is ensured with the aid of an organic binder. The green sheet can be shaped by sheet drawing, casting or any other conventional technique.

The second green sheet GF2 is printed with an electrode material which can be sintered to form an electrode layer ES2. Furthermore, at least two plated-through holes DK are provided in said green sheet, said plated-through holes being produced, for example, by holes being stamped into the green sheet. Afterward the plated-through holes are filled with a conductive compound, usually with the electrode material.

The third green sheet GF3 illustrated is similar to the second green sheet, but the plated-through holes and the structure of the printed electrode material in both green sheets GF2, GF3 are applied in a horizontally mirrored fashion in order to connect the respective electrode layer ES in the varistor to different plated-through holes and thus to different contacts.

Figure 7:
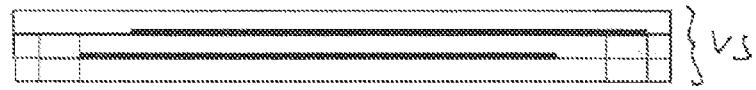
FIG. 7 shows a varistor layer after the green sheets have been stacked one above another and after the stack has been sintered.

FIG. 7 shows the green sheets illustrated in FIG. 6 stacked one above another to form a varistor layer VS. The figure illustrates only two inner electrode layers ES in order to clarify the alternating arrangement of the electrode layer.

In order to achieve the necessary current-carrying capacity, an expedient varistor, that is to say a chip with varistor function, generally comprises a plurality of electrode layers alternately connected to different contacts. In the illustrated stack, the electrode layers are alternately assigned to two plated-through holes arranged congruently or in an overlapping manner in the stack in order to ensure a continuous line of conduction through to a main surface, here the first main surface. As the topmost layer, here a green sheet without any plated-through hole and without an electrode layer is applied, which serves for covering the inner electrode layers ES.

It goes without saying that it is also possible to use green sheets having plated-through holes which, from the second main surface, too, enable an excess to inner electrode layers or the later external contacts on the first main surface.

In the next step, the stack of green sheets placed one above another and possibly pressed is sintered, the chip arising as a solid monolithic composite made from the originally separate green sheets. The binder burns out completely and metallic electrode layers, the ceramic varistor layer and purely metallic plated-through holes remain in the chip.

Figure 8:
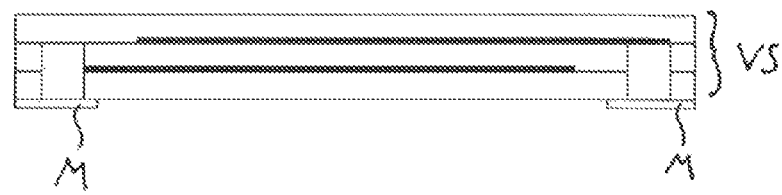
FIG. 8 shows the arrangement after the application of external contacts.

The varistor layer VS obtained after sintering is then provided with a metallization M for the external contacts AK. For this purpose, a metallization paste is printed onto the corresponding main surface such that the metallization is in contact with a respective plated-through hole DK. FIG. 8 shows the arrangement at this method stage.

Afterward, a layer of a glass-containing paste with the specifications already mentioned is printed onto the first main surface such that only the metallizations M provided for the external contacts continue not to be covered by the glass paste layer. This can be carried out by screen printing or some other spatially resolving method. Afterward, the entire arrangement is subjected to a further sintering process, wherein a fixedly adhering metallization and the now impermeable and likewise fixedly adhering glass layer GS are obtained.

Alternatively, the metallization paste can be fired before the glass paste is applied, and the glass layer can be fired separately in a further sintering process.

Figure 9:
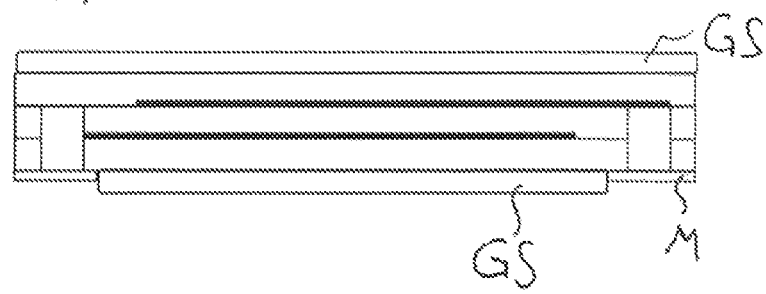
FIG. 9 shows the arrangement after the application of a glass layer.

FIG. 9 shows the arrangement with fired metallizations M for external contacts and a fired glass layer GS.

In the next step, the metallizations M that have hitherto only been printed and fired are reinforced electrolytically or in an electroless manner in order to obtain solderable surfaces. For this purpose, conventional standardized electroplating baths are used, which are usually set up to be basic or acidic.

Suitable depositable metals for the external contacts AK, which can also be used for the connection pads AF, comprise nickel and gold and/or nickel and silver layers. However, other metallizations comprising other metals and, if appropriate, further layers can also be applied electrolytically or in an electroless manner, without the properties of the chips CH, in particular the varistor function, being detrimentally affected thereby.

Figure 10:
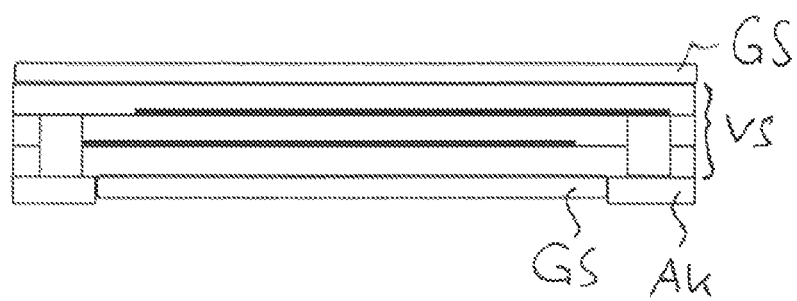
FIG. 10 shows the finished chip after the thickening of the metallization for the external contacts.

FIG. 10 shows the arrangement after the thickening or completion of the external contacts AK. Depending on the desired use, the thickness of the external contacts AK can exceed the thickness of the glass layer GS. Glass layer and metallization or external contacts and glass layer can also terminate flush with one another. It is also possible to recess the external contacts AK and connection pads AF (not illustrated in FIGS. 6-10) in the glass layer GS, such that they lie at a deeper level than the surface of the glass layer.

Although only the production of external contacts AK, that is to say of solderable metallizations on a first main surface of the chip, has been described in the figures, nevertheless connection pads AF can also be produced on the second main surface of the chip in the same way and in parallel with the external contacts AK.

In one exemplary embodiment, a glass paste having the following composition is chosen for producing the glass layer GS: 78% by weight $SiO_2$, 19% by weight $B_2O_3$ and 3% by weight $K_2O$. Such a glass has a softening point of 775° C. and, after sintering, has a coefficient of thermal expansion of approximately 2.8 ppm/K. Firstly, however, a glass paste is produced from the glass powder or the finely distributed and homogeneously mixed oxides. In parallel therewith a varistor layer VS is processed up to the method stage illustrated in FIG. 8 that is to say up to the production of the first metallization M before the application of the glass layer GS. At this stage, the varistor properties are determined for comparison purposes. Afterward, the glass paste is printed and fired and the varistor is measured again.

It is found that the varistor voltage remains unchanged and that the leakage current does not exceed the permissible current intensities and is less than 0.1 µA in the exemplary embodiment.

An electroplating is subsequently carried out on the test components in order to thicken the metallizations M to the desired layer thickness of the external contacts AK and connection pads AF. A further determination of the varistor values at this method stage shows that the electroplating had no negative effects whatsoever on the varistor properties.

This proves that the varistor function is not adversely influenced by the printed and fired glass layer nor is the varistor layer damaged by the subsequent electroplating bath.

In a parallel experiment, a glass paste is used in which 15% by volume of zirconium oxide powder is added as filler to the glass composition. This glass layer is also fired at approximately 850° C. An electrical measurement of the chip reveals that here, too, the varistor function or the electrical varistor properties are not altered negatively.

With the chip according to the invention it is possible to realize a varistor which has a varistor voltage in the range of approximately 10 V with a structural size of, for example, 1.2×1.2 mm² and a layer thickness of 250 µm. The clamping voltage $U_c$ (residual voltage) is typically at the maximum of 100 V in the case of a standardized 8 kV pulse. This shows that the chip with the varistor function can manifest an excellent protective effect even with this small structural size. As a result of the high thermal conductivity, the small structural size and the contacts that are structurable without any problems, the chip can be used as a substrate for electrical components such as for LEDs, for example.

Figure 11A:
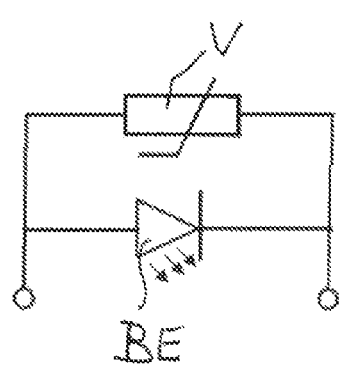
FIGS. 11a and 11b show two possible interconnections of a chip with varistor function with an electrical component to be protected.
Figure 11B:
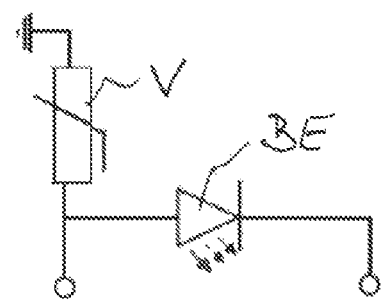

FIGS. 11a and 11b show different possibilities of how the chip with varistor function can be interconnected with an electrical component and here in particular with a light emitting diode.

In FIG. 11a, the varistor V is connected in parallel with the component BE. In the event of the varistor voltage being exceeded, the current can thus flow away through the varistor V and in this case as it were short-circuit the component until the harmful voltage has been reduced.

In FIG. 11b, the varistor V is connected in parallel with the component BE with respect to ground. In the event of the varistor voltage being exceeded, it is thus possible to dissipate the harmful overvoltage or the current through the varistor V to ground. In both cases, the component remains protected against harmful overvoltages above the varistor voltage.

In this interconnection, which is preferably realized in an arrangement in accordance with FIG. 5, the chip according to the invention is designed to dissipate excess waste heat or heat loss such as that of the LED component reliably through the varistor layer to the external contacts, where it can be dissipated harmlessly at a heat sink within a PCB (printed circuit board).

The invention is not restricted to the structures and methods illustrated in the exemplary embodiments. In particular, the electrode structure of the varistor layer can have an arbitrary number of electrode layers and an arbitrary structuring. The number of green sheets, plated-through holes, external contacts and connection pads can also be chosen arbitrarily and be adapted to the requirements for a desired use. Only external contacts or both external contacts and connection pads may be provided, which individually and independently of one another may or may not be connected to the electrode structure.

The invention claimed is:

1. A chip comprising:
a varistor layer composed of zinc oxide;
a multilayered electrode structure which realizes a varistor function in the varistor layer;
at least two solderable or bondable external contacts on a first main surface of the varistor layer; and
a glass layer disposed on the first main surface leaving only the external contacts uncovered,
wherein the glass layer comprises, as main constituents, oxides of Si and/or Ge, B and K, which in total comprise at least 70% by weight of the constituents of the glass layer, and
wherein the glass layer is substantially free of Al, Ga, Cr and Ti.

2. The chip according to claim 1, further comprising electrical connection pads on a second main surface of the varistor layer, the electrical connection pads configured to connect an electrical component.

3. The chip according to claim 2, wherein the external contacts and the connection pads are deposited electrolytically, and wherein the external contacts and the connection pads comprise at least one of Ni, Ag and Au.

4. An arrangement comprising:
a chip according to claim 2; and
an electrical component,
wherein the electrical component is mounted on the second main surface of the varistor layer and is electrically connected to the connection pads, and
wherein the electrical component is interconnected with the electrode structure and with the external contacts.

5. The arrangement according to claim 4, wherein the electrical component is an LED.

6. The chip according to claim 1, wherein the electrode structure comprises at least 4 electrode layers arranged one above another and alternately connected to the two external contacts.

7. The chip according to claim 1, wherein the glass layer is free of ZnO and $Bi_2O_3$.

8. The chip according to claim 1, wherein the glass layer contains a filler having a better thermal conductivity than quartz.

9. The chip according to claim 8, wherein the glass layer comprises solid filler particles composed of $ZrO2$.

10. The chip according to claim 1, wherein the glass layer contains, as further constituents, oxides of metals selected from Li, Na, Mg, Ca, Sr and Ba.

11. The chip according to claim 10, wherein the constituents Li and Na are contained in proportions of up to, in each case, a maximum of 5% by weight, and the others up to, in each case, a maximum of 15% by weight.

12. The chip according to claim 1, wherein the chip comprises a maximum thickness of 1000 µm.

13. The chip according to claim 1, wherein the chip comprises a maximum thickness of 500 µm.

14. The chip according to claim 1, wherein the chip comprises a maximum thickness of 250 µm.

15. A method for producing a chip, the method comprising:
producing a stack by stacking green sheets composed of a ZnO one above another, the green sheets comprising a print with an electrode material;
sintering the stack of green sheets thereby forming a varistor layer having a multilayered electrode structure;
printing a metallization paste on a first and/or a second main surface of the varistor layer for defining external contacts and/or connection pads;
printing a glass paste thereon in a structured manner such that areas provided for the external contacts and/or the connection pads remain uncovered;
firing and sintering the metallization paste and the glass paste thereby producing a metallization and a structured glass layer, wherein the glass layer comprises, as main constituent, oxides of Si and/or Ge, B and K, which in total comprise at least 70% by weight of the constituents of the glass layer, and wherein the glass layer is substantially free of Al, Ga, Cr and Ti; and
reinforcing electrolytically or electroless regions of the metallization which are provided for the external contacts and/or the connection pads and which are not covered by the glass layer.

* * * * *